(12) United States Patent
Street et al.

(10) Patent No.: US 6,940,142 B2
(45) Date of Patent: Sep. 6, 2005

(54) LOW DATA LINE CAPACITANCE IMAGE SENSOR ARRAY USING AIR-GAP METAL CROSSOVER

(75) Inventors: Robert A. Street, Palo Alto, CA (US); Ping Mei, Palo Alto, CA (US); Jeffrey T. Rahn, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 614 days.

(21) Appl. No.: 09/898,321

(22) Filed: Jul. 2, 2001

(65) Prior Publication Data

US 2003/0001222 A1 Jan. 2, 2003

(51) Int. Cl.[7] .............................................. H01L 31/00
(52) U.S. Cl. ...................... 257/443; 257/448; 257/81
(58) Field of Search ........................ 257/13, 81, 91, 257/918, 307, 443, 448, E29.151, E29.117, E29.202, E29.273

(56) References Cited

U.S. PATENT DOCUMENTS

| | | | | |
|---|---|---|---|---|
| 3,846,820 A | * | 11/1974 | Lampe et al. | 257/443 |
| 4,141,055 A | * | 2/1979 | Berry et al. | 361/778 |
| 5,216,537 A | * | 6/1993 | Hornbeck | 438/23 |
| 5,262,649 A | * | 11/1993 | Antonuk et al. | 250/370.09 |
| 5,449,953 A | * | 9/1995 | Nathanson et al. | 257/728 |
| 5,587,591 A | * | 12/1996 | Kingsley et al. | 257/59 |
| 5,604,658 A | * | 2/1997 | Pedder | 361/277 |
| 5,623,161 A | * | 4/1997 | Fukuda et al. | 257/649 |
| 5,712,494 A | * | 1/1998 | Akiyama et al. | 257/59 |
| 5,789,737 A | * | 8/1998 | Street | 250/208.1 |
| 6,037,248 A | * | 3/2000 | Ahn | 438/619 |
| 6,064,118 A | * | 5/2000 | Sasaki | 257/758 |
| 6,078,088 A | * | 6/2000 | Buynoski | 257/410 |
| 6,107,641 A | | 8/2000 | Mei et al. | |
| 6,337,284 B1 | * | 1/2002 | Hwang et al. | 438/710 |
| 2002/0135041 A1 | * | 9/2002 | Kunikiyo | 257/510 |

OTHER PUBLICATIONS

Mulato et al., "Simulated and measured data–line parasitic capacitance of amouphous silicon large–area image sensor arrays", J. Applied Physics, vol. 89, p. 638 (2000).*

"Large Area Image Sensor Arrays", in Technology and Applications of Amorphous Silicon, Editor R..A. Street, Springer Series in Materials Science 37, Springer–Verlag, Berlin, 2000, Chapt. 4, pp. 147–221 (60 pgs.).

* cited by examiner

Primary Examiner—Tom Thomas
Assistant Examiner—N. Drew Richards
(74) Attorney, Agent, or Firm—Bever, Hoffman & Harms, LLP; Patrick T. Bever

(57) ABSTRACT

The signal-to-noise ratio of amorphous silicon (a-Si:H) image sensor arrays is limited by electronic noise, which is largely due to data line capacitance. To reduce data line capacitance, an air-gap (i.e., vacuum or gas-filled space) is produced at crossover points separating the data lines and gate lines. This air-gap crossover structure is formed by depositing a release material on the gate lines, forming the data lines on the release material, and then removing (etching) the release material such that the data lines form an arch extending over the gate lines. A dielectric material is then applied to strengthen the data line, and the sensor pixels are then formed.

20 Claims, 3 Drawing Sheets

LOW DATA LINE CAPACITANCE IMAGE SENSOR ARRAY USING AIR-GAP METAL CROSSOVER

FIELD OF THE INVENTION

This invention relates to integrated circuit arrays, and in particular to those devices containing a pixel array. The invention is most particularly applicable to amorphous silicon X-ray image sensor arrays.

BACKGROUND OF THE INVENTION

Two-dimensional amorphous silicon (A—Si:H) sensor arrays are well-known devices for real time imaging of incident high energy radiation (see R. A. Street et al., "Large Area Image Sensor Arrays", in Technology and Applications of Amorphous Silicon, Editor R. A. Street, Springer Series in Materials Science 37, Springer-Verlag, Berlin, 2000, chapter 4, p.147, for a general description of the structure of the arrays). Such sensor arrays are particularly advantageous for X-ray imaging because they present a relatively large size image sensor array. Each sensor operates on the principal of integrating a charge representative of the quantities of ionizing radiation incident on the sensor. In the direct detection approach, incident high-energy radiation (e.g., X-ray photons) is directly converted to a charge by the sensor. In the indirect detection approach, a phosphor converter absorbs high energy radiation (e.g., X-ray photons) and generates a proportional amount of visible light that is then converted to a charge by the sensor.

To minimize the X-ray dose to patients during medical imaging, there is a need for a-Si:H sensor arrays having the highest possible signal-to-noise ratio. In general, the signal-to-noise ratio of an image sensor array is limited by the electronic noise generated in the array, particularly for imaging conditions when the X-ray dose is low. There are a number of sources of this electronic noise in an image sensor array. A first source is generated by the resistance of the thin-film transistor (TFT) utilized to access the individual image sensors during readout, combined with the sensor capacitance, which gives a noise power of $2\,kTC_S$ (where k is the Boltzmann constant, T is temperature in degrees Kelvin, and $C_S$ is the sensor capacitance). A second source is data line capacitance $C_D$, which acts on the input of the readout amplifiers of the image sensor array to contribute a noise of $N_0+\beta C_D$, where $N_0$ is typically 200 electrons and $\beta$ is the noise slope of about 15 e/pF. A third source is generated by thermal noise of the data line resistance, which can be represented by $4\,kTR_D\Delta f$, where $R_D$ is data line resistance, and $\Delta f$ is typically 1 MHz, but depends on the speed of the readout amplifier. A fourth source of electronic noise is line-correlated noise that is capacitively coupled from the gate and bias line power supplies to the data line, and is proportional to the data line capacitance.

Of the various sources of electronic noise in large area and high-resolution image sensor arrays, data line capacitance tends to be the largest noise source, since it is proportional to the very large number of pixels (i.e., individual sensors and associated TFTs) coupled to each data line. For a typical array, the data line capacitance per pixel is 30–50 fF, which gives a total capacitance of about 100 pF, and an amplifier noise of about 1700 electrons. The kTC noise of each sensor is typically in the range of 300–600 electrons, depending on the size of the pixel, and the thermal noise of the data line can be made small by choosing a low resistance metal and limiting the amplifier bandwidth. The line-correlated noise can be minimized by very careful design of the power supplies, but for very large arrays is about 1000 electrons. With these parameters, data line capacitance becomes the most significant source of electronic noise, and a reduction in the data line capacitance could significantly reduce the electronic noise, which would also reduce the requirements for very high performance readout amplifiers and very low noise power supplies. Most importantly, reducing the noise produced by reducing data line capacitance would increase the signal-to-noise ratio of the sensor array, thereby facilitating medical imaging using lower X-ray doses.

Accordingly, what is needed is an image sensor that significantly reduces data line capacitance to significantly increase the signal-to-noise ratio of the sensor array.

SUMMARY OF THE INVENTION

The present invention is directed to an image sensor or other integrated circuit in which data line capacitance is significantly reduced by forming an air-gap crossover structure at each data line/gate line crossover location. The air-gap crossover structure provides a substantially lower dielectric constant (when compared to conventional solid insulator material) that minimizes capacitive coupling between the data and gate lines. Accordingly, an array structure is provided that significantly reduces data line capacitance to increase the signal-to-noise ratio, thereby facilitating, for example, high resolution medical imaging using substantially lower X-ray doses.

In accordance with an embodiment of the present invention, an image sensor array includes a plurality of pixel circuits arranged in rows and columns, each pixel circuit including an a-Si:H image sensor and an access thin-film transistor (TFT) for transferring a charge from the image sensor to a data line under the control of a gate line. The gate lines are arranged such that each gate line controls one row of pixels, and the data lines are arranged such that each data line transfers charge from one column of pixels to a readout amplifier.

In accordance with a primary aspect of the present invention, the data lines of the image sensor array are formed such that each data line extends over the gate lines at corresponding crossover locations, and such that each data line is separated from the gate lines at the crossover locations by an air-gap (i.e., vacuum or gas-filled region), thereby minimizing capacitive coupling between the data lines and gate lines at the crossover locations by eliminating conventional solid insulators.

In accordance with other optional aspects of the present invention, data line capacitance is further reduced by forming the access TFT of each pixel using a non-overlapping source/drain structure to reduce overlap capacitance, and/or by forming the a-Si:H sensor using a thick buried insulator to reduce sensor capacitance. By combining these aspects with the air-gap crossover structure, an image sensor array is produced that exhibits significantly lower data line capacitance than that of conventional image sensor arrays.

In accordance with another embodiment of the present invention, a method for fabricating an integrated circuit array includes forming a release material pattern over a set of first (e.g., gate) lines, forming a set of second (e.g., data) lines such that a portion of the release material is located between the first and second lines at each crossover location, and then removing the release material to form an air-gap. The release material is selected such that it etches at a higher rate than the metal layers utilized to form the first and second lines, thereby allowing the release material to be selectively removed from between the first and second lines to form the air-gap crossover structure. After the release material is removed, each crossover location is overcoated with a strengthening insulator, and then an access transistor (e.g., a TFT), an insulator, and remaining portions of a pixel circuit (e.g., a sensor or liquid crystal display element) are fabricated according to known techniques.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention provides structures and methods for reducing address line (e.g., data line) capacitance in integrated circuit arrays by forming an air-gap crossover structure at each location where the address line crosses a noise-generating structure, such as a gate line. While the present invention is described below with specific reference to data line/gate line crossover structures, the crossover structure may be beneficially utilized to reduce address line noise from other noise generating structures. In addition, while the present invention is described below with specific reference to image sensor arrays, the present invention may be beneficially utilized in other integrated circuit arrays having pixel elements that benefit from reduced data line capacitance, such as liquid crystal displays or low voltage integrated circuits.

Figure 1:
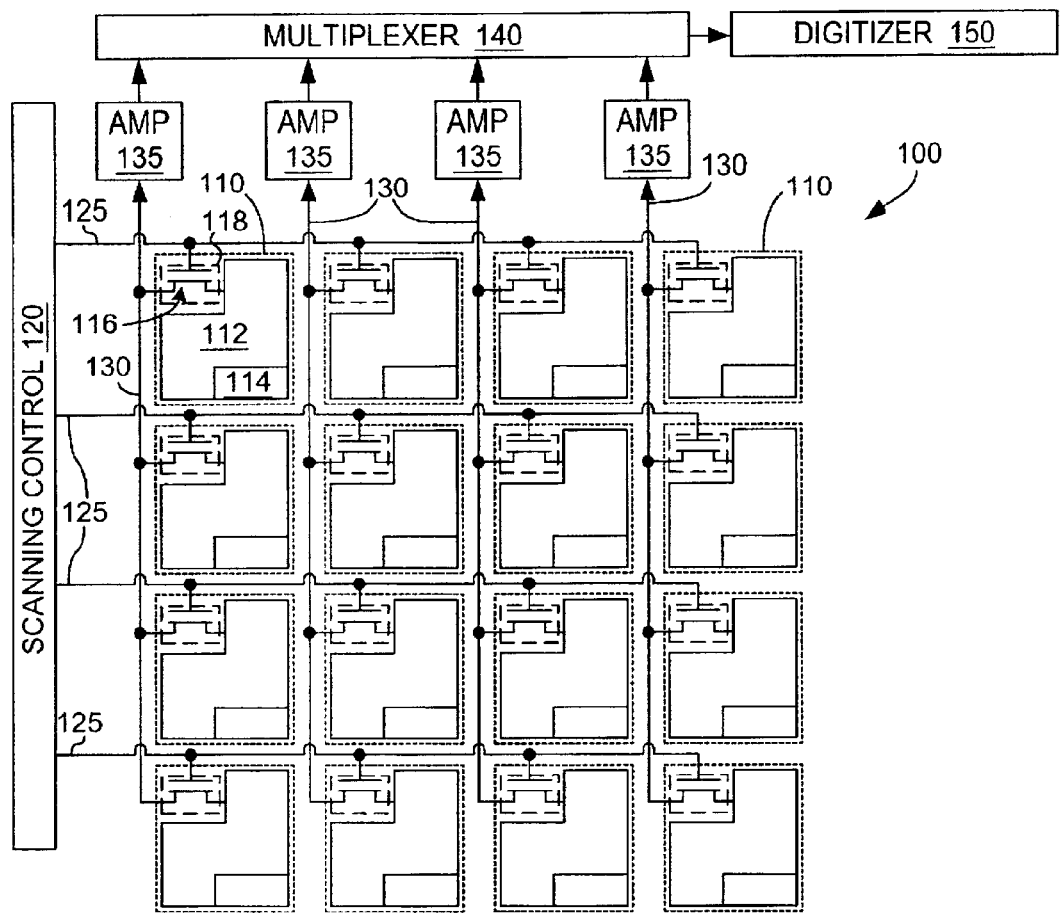
FIG. 1 is a simplified circuit diagram showing an image sensor array according to an embodiment of the present invention.

FIG. 1 shows a simplified image sensor 100, which represents an integrated circuit array according to one embodiment of the present invention. Image sensor 100 includes an array of pixels 110, each pixel 110 including a sensor 112, an optional storage capacitor 114, and a thin film transistor (TFT) (access transistor) 116 that may be covered by an optional light shield 118. An external scanning control circuit 120 turns on the TFTs 116 one row at a time via a series of parallel gate lines 125. As each row of TFTs 116 is turned on, an image charge is transferred from the corresponding sensors 112 to a series of parallel data lines 130, which are respectively connected to external readout amplifiers 135. At the same time, readout amplifiers 135 reset the potential at each sensor 112. The resulting amplified signal for each row is multiplexed by a parallel-to-serial converter or multiplexer 140, and then transmitted to an analog-to-digital converter or digitizer 150.

Figure 2:
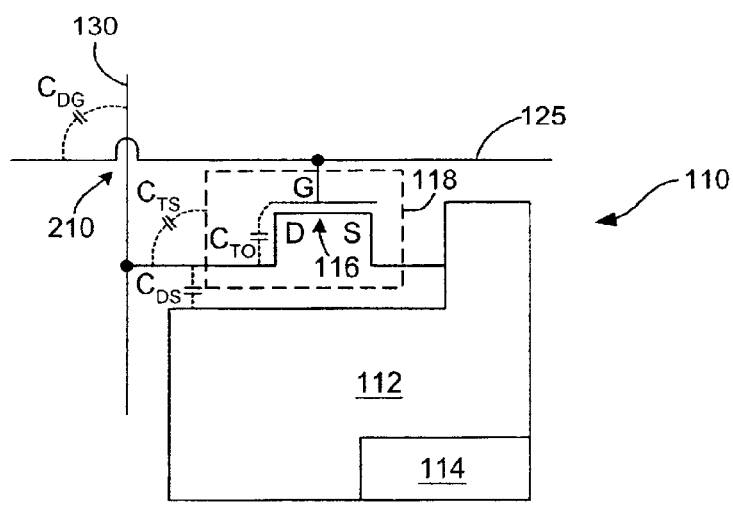
FIG. 2 is a simplified diagram showing a single pixel circuit of the sensor array shown in FIG. 1.

FIG. 2 shows a pixel circuit 110 of image sensor 100 in additional detail. Each TFT 116 has three electrical connections: a source S connected to sensor 112 and pixel storage capacitor 114; a drain D connected to a data line 130 that is shared by all pixels of the same column; and a gate G formed by a corresponding gate line 125 that is shared by all pixels in the same row.

As discussed above, the signal-to-noise ratio of a-Si:H image sensor array 100 is limited by electronic noise, and the main contribution to that noise in present devices is the data line capacitance $C_D$ of each data line 130 that forms the input to readout amplifiers 135 (shown in FIG. 1). As also discussed above, the data line capacitance $C_D$ has several sources arising from the design of sensor array 100.

Data line capacitance $C_D$ can be expressed as the sum of the individual pixel capacitance $C_P$ at each pixel and the number of pixels N (i.e., $C_D=NC_P$). Referring to FIG. 2, the present inventors have determined that pixel capacitance $C_P$ of each sensor pixel 110 can be expressed by the following Equation 1:

$$C_P=C_{DG}+C_{TO}+C_{TS}+C_{DS} \qquad \text{Eq. 1}$$

Cross-over capacitance $C_{DG}$ is the capacitance generated at gate line/data line cross-over 210, which is an essential part of the addressed array design shown in FIG. 1, and is approximately represented by Equation 2

$$C_{DG}=C_{D1}W_G W_D \qquad \text{Eq. 2}$$

In Equation 2, $C_{D1}$ represents the capacitance per unit area of the dielectric material separating gate line 125 and data line 130, $W_G$ is the width of gate line 125, and $W_D$ is the width of data line 130. Overlap capacitance $C_{TO}$ is produced by the drain/gate overlap of TFT 116 when turned off, and is approximately represented by Equation 3:

$$C_{TO}=C_{D2}WD_o \qquad \text{Eq. 3}$$

In Equation 3, $C_{D2}$ represents the capacitance per unit area of the dielectric material located in the TFT overlap, W is the TFT width, and $D_o$ is the size of the overlap. Note that the channel capacitance of TFT 116 is ignored because only one of many TFTs in each column is turned on at any given time. Light shield capacitance $C_{TS}$ represents the capacitance between TFT 116 and optional light shield 118, which is usually placed over TFT 116 and is assumed to have a width equal to that of gate line 125. With this assumption, light shield capacitance $C_{TS}$ is approximately represented by the Equation 4:

$$C_{TS}=C_{D3}WD_C \qquad \text{Eq. 4}$$

In equation 4, $C_{D3}$ represents the capacitance per unit area of the dielectric material between TFT 116 and light shield 118, W is the TFT/light shield width, and $D_C$ is the size of the drain contact. Finally, sensor capacitance $C_{DS}$ represents the capacitance between data line 125 and sensor 112 (in cases where sensor 112 and data line 125 overlap), and can be approximated by multiplying the capacitance ($C_{D4}$) per unit area of the dielectric material between data line 125 and sensor 112 with the area of sensor 112. When sensor 112 and data line 125 do not overlap, sensor capacitance $C_{DS}$ is generated solely by fringing effects, discussed below.

For comparison purposes, the above equations were utilized to calculate the data line capacitance for a conventional image sensor array including 1536 by 1920 pixels. Each sensor 112 has a size of 127 by 127 microns. The dielectric insulator used in each TFT 116 is silicon oxy-nitride having a thickness about 1 micron, and each TFT 116 has length of 11 microns and a width of 20 microns. The source and drain overlaps of TFT 116 are 3 microns. With this conventional image sensor the capacitive components making up data line capacitance $C_D$ for each pixel circuit 110 are $C_{DG}$=12 fF, $C_{TO}$=14 fF, $C_{TS}$=8 fF, and $C_{DS}$=10 fF, for a total of 44 fF/pixel. In estimating these capacitance components there are some fringe fields (fringing effects) that make the effective areas larger than the actual geometrical areas. In the calculations above the chosen values for pixel area are increased to account for these fringing effects. However, when the above analysis is applied to high fill factor and direct detection sensor arrays, the data line capacitance can reach 90 fF/pixel. Such high fill factor and direct detection sensor arrays are important because they are intended for high performance, high resolution imaging by allowing increased sensor coverage of the pixel, higher resolution designs and higher X-ray sensitivity. To facilitate high fill factor, data line capacitance $C_D$ is increased because the gate-to-data crossovers are located between the metal layers utilized to form the gate line and data line, which increases the capacitance by about a factor of four. Also, the sensor is placed over the data line in these high fill factor sensor arrays, which further increases capacitance. Therefore, for the same array and pixel parameters utilized above, the component capacitances would be approximately $C_{DG}$=48 fF, $C_{TO}$=14 fF, $C_{TS}$=8 fF, and $C_{DS}$=20 fF, which produces the 90 fF/pixel data line capacitance mentioned above. Note that more recently developed high fill factor array designs have reduced the gate and data line widths, with a corresponding reduction in the capacitance.

According to the present invention, sensor array 100 is modified to reduce data line capacitance by providing a bridge structure formed at each data line/gate line (metal) crossover 210 (shown in FIG. 2) that reduces the crossover capacitance $C_{DG}$ in comparison with conventional solid dielectric crossover structures by providing a vacuum or gas-filled space (referred to herein as an "air-gap") between the data and gate lines at each crossover 210. In combination with various optional design techniques, some previously proposed, the air-gap crossover structure of the present invention produces a sensor array exhibiting greatly reduced data line capacitance $C_D$. As discussed in detail below, a first optional design technique reduces the overlap capacitance $C_{TO}$ component of data line capacitance $C_D$ by utilizing a self-aligned TFT structure. According to another design technique directed to high fill factor pixel circuits, the light shield capacitance $C_{TS}$ and sensor capacitance $C_{DS}$ component of data line capacitance $C_D$ are reduced by providing a thick, low dielectric constant insulation layer between the TFT and the pixel sensor. Both the self-aligned TFT structure and the thick dielectric are previously proposed, and can be separately or in combination with the air-gap crossover structure of the present invention to reduce data line capacitance $C_D$. Note that when one or more of the overlap capacitance $C_{TO}$, the light shield capacitance $C_{TS}$, and the sensor capacitance $C_{DS}$ are reduced using these design techniques, the crossover capacitance $C_{DG}$ becomes a significant source of data line capacitance $C_D$. Accordingly, when combined with the self-aligned TFT and thick dielectric, the air-gap formed at each data line/gate line (metal) crossover 210 (shown in FIG. 2) produces a sensor array in which the capacitance $C_D$ of data lines 130 is dramatically reduced over conventional sensor arrays, resulting in a greatly improved imager performance at lower X-ray doses.

Figure 3:
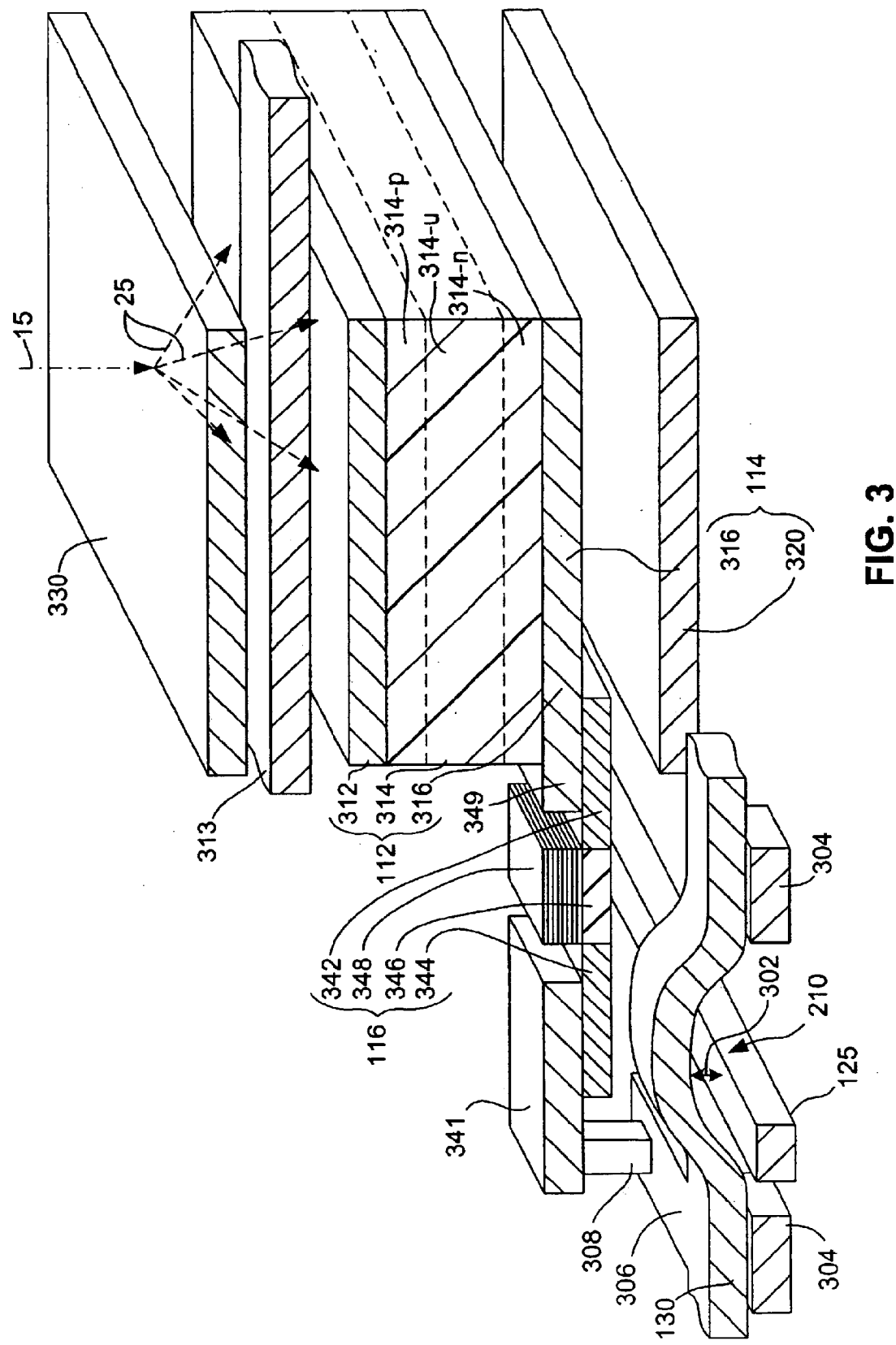
FIG. 3 is a front perspective view depicting a portion of the pixel circuit including an air-gap crossover according to an embodiment of the present invention.

FIG. 3 is a simplified perspective view showing selected portions of pixel circuit 110 incorporating the air-gap crossover structure and self-aligned TFT according to an embodiment of the present invention. Note that passivation (insulation) layers are omitted from FIG. 3 to facilitate the following description. As discussed above with reference to FIG. 2, pixel circuit 110 includes a sensor 112, a capacitor 114, and an access TFT 116 that is connected to a gate line 125 and a data line 130.

In accordance with a primary aspect of the present invention, an air-gap crossover structure is provided between gate line 125 and data line 130 at crossover location 210 that provides an air-gap 302 to minimize capacitive coupling between data line 130 and gate line 125 at crossover location 210. Air-gap 302 is formed in accordance with the method illustrated in FIGS. 4(A) through 4(E), which are described in detail below. Optional spaced-apart support pads 304 are located on opposite sides of air-gap 302 to support and maintain the position of data line 125 relative to gate line 130.

Figure 4A:
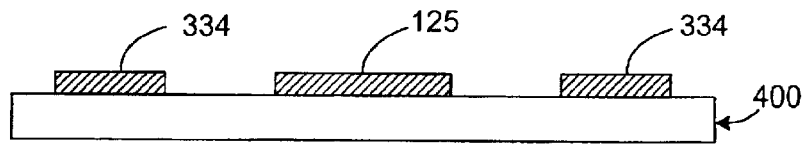
FIGS. 4(A) through 4(E) are cross-sectional side views showing a method for making a pixel circuit according to another embodiment of the present invention.

Referring to FIG. 4(A), a method for making image sensor array 100 (described above with reference to FIG. 1) begins with the formation of gate lines 125 (shown in end view) on a substrate 400 (e.g., silicon). In one embodiment, gate lines 125 are formed by depositing a first metal layer (e.g., Cr or another suitable metal), patterning the first metal layer, and then etching using, for example, Cr, cerium ammonium nitrate and acetic acid according to known techniques. Optional spaced-apart data line support pads 304 are also patterned and etched from the first metal layer using the same process utilized to form gate lines 125.

Figure 4B:
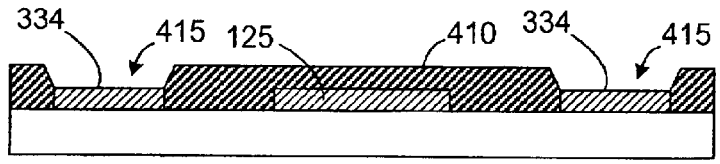

FIG. 4(B) shows a subsequent step of forming a release material 410 over the gate lines 125. In one embodiment, release material 410 is formed by depositing a second layer (e.g., at least one of photoresist, Si, and Al), patterning the second layer, and then etching using known techniques. Note that when spaced-apart data line support pads 304 are provided, release material 410 is etched to define windows 415 that expose upper surfaces of the spaced-apart data line support pads 304.

Note that the term "release material" is used in the field of micro-electrical mechanical systems (MEMS) to describe an intermediate layer that is removed to form a free standing structure. A typical MEMS arrangement includes a metal bridge or cantilever structure having at least one anchored portion secured to a substrate, and a free standing portion initially formed on a pad of material (the "release material") that, when exposed to a selected etchant, is etched at a substantially higher rate that the metal portion. Because the function of release material 410 is otherwise similar to that used in the context of such MEMS structures, the same term is utilized herein to describe the formation of air-gap 302.

Figure 4C:
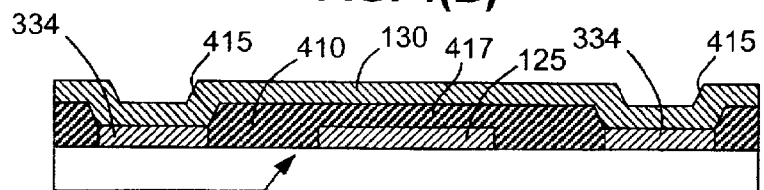

Referring to FIG. 4(C), data lines 130 are then formed such that each data line 130 extends over gate lines 125 at corresponding crossover locations 210, and is separated from a portion of gate lines 125 located directly over gate line 125 by a release material portion 417 which has a thickness in the range of 0.2 to 1 micron. In one embodiment, data lines 130 are formed by depositing and patterning a second metal layer (e.g., TiW), and then etching the second metal layer using known techniques. When optional spaced-apart data line support pads 304 are provided, data lines 130 are formed such that they extend through openings 415 to contact associated pairs of spaced-apart data line support pad 304. Note that the etchant used to form data lines 130 (e.g., hydrogen peroxide) is selected such that it does not damage release material 410.

Figure 4D:
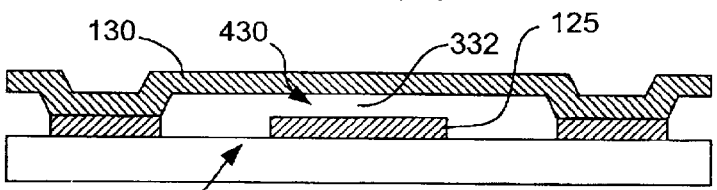

FIG. 4(D) shows a subsequent release (etch) process during which release material is etched using a suitable etchant 430 in a manner that does not significantly damage data lines 130 and gate lines 125. Accordingly, release material portion 417 (see FIG. 4(C) is removed from crossover location 210 such that an air-gap 302 is defined between data line 130 and gate line 125. This release process is performed using, for example, a mixture of phosphoric and nitric acid (for Al release material), standard resist developer (for photoresist release material), or $XeF_2$ (for amorphous silicon release material)

Figure 4E:
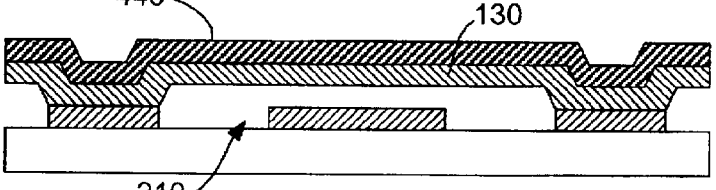

FIG. 4(E) shows the formation of an optional strengthening insulator 440 on data lines 130 at the crossover locations 210. A suitable strengthening insulator 440 includes Silicon-Nitride (SiN) having a thickness of 0.1 to 0.3 microns, and is formed using a plasma-enhanced CVD process according to known techniques.

Referring again to FIG. 3, in one embodiment, the formation of data line 130 also comprises forming a lateral portion 306, which is formed using the second metal layer, and a metal via 308, which is formed using subsequent metal layers (discussed below) to provide electrical contact to TFT 116 (discussed below). In an alternative embodiment, a lateral portion can be formed using the first metal layer and extends from support pads 304.

After gate lines 125 and data lines 130 are formed in the manner described above, the fabrication process proceeds with the formation of sensor 112, capacitor 114, and TFT 116.

In accordance with the disclosed embodiment, sensor 112 includes an a-Si:H (charge sensing) region 314 formed by a continuous a-Si:H layer (not shown) that is sandwiched between an upper metal plate 312 and a lower metal plate 316. A—Si:H region 314 includes a thin p-type doped upper layer 314-p located next to upper plate 312, a thicker undoped middle layer 314-u, and a thin n-type doped lower layer 314-n located next to lower plate 316. Upper layer 314-p, middle layer 314-u, and lower layer 314-n are formed according to known practices, and the order of upper layer 314-p and lower layer 314-n can be reversed (i.e., with n-type doping in the upper layer and p-type doping in the lower layer). Upper plate 312 contacts a bias (metal) line 313, and is formed from a conductive transparent material (e.g., Indium-Tin Oxide (ITO)) to facilitate transmission of light beams 25 into doped a-Si:H region 314. Lower metal plate 316 includes a portion that contacts a source terminal of access TFT 116, which is discussed below.

Capacitor 114 is formed by lower plate 316 of sensor 112 and a third plate 320 that is separated from lower plate 316 by a passivation (insulation) layer (not shown). The capacitance of a-Si:H sensor 112, which is determined in part by the size of third plate 320, is selected to facilitate either radiographic or fluoroscopic imaging operations. In one embodiment, third plate 320 is formed using the first metal layer that is used to form gate lines 125, or the second metal layer that is used to form data lines 130.

In accordance with an optional aspect of the present invention, TFT 116 is fabricated in accordance with the teachings of U.S. Pat. No. 6,107,641 (Mei et al.), which is incorporated herein by reference in its entirety. According to the teachings of Mei et al., source/gate and drain gate overlaps are eliminated using a laser doping technique to form a self-aligned source region 342 and a self-aligned drain region 344 that are separated by a relatively undoped channel region 346. Source region 342 and drain region 344 (as well as channel region 346) are formed from a continuous a-Si:H layer sandwiched between Nitride layers, and upon which is formed an optical filter island 348. Optical filter island 348 includes at least three layers of materials having differing indexes of refraction (e.g., alternating layers of SiN and $SiO_2$, with SiN being located in the uppermost and lowermost layers), and is utilized during laser doping to resist the diffusion of dopant into channel region 346. Optical filter island 348 is formed by patterning a resist layer using backside exposure (i.e., through the underlying substrate) in which gate line 125 acts as a mask, thereby self-aligning optical filter island 337 to gate line 125. After forming optical island 348, a doping source film is positioned over source region 342 and drain region 344, and a laser beam is directed from above to ablate the source film, thereby releasing energetic dopant atoms that enter (dope) source region 342 and drain region 344. Importantly, optical filter island 348 is opaque (for example by reflectance via interference) to the laser beam. Therefore, the region under island 348, namely channel 346, remains relatively undoped. After source region 342 and drain region 344 are formed, metal drain contact 341 and a metal source contact 349 are formed (i.e., using the same metal layer that is used to form lower plate 316) to provide respective contacts to data line 125 (via lateral portion 306 and metal via 308) and to lower plate 316 of sensor 112.

Referring to the upper portion of FIG. 3, pixel circuit 110 also includes an optional phosphor converter 330 that facilitates indirect detection by converting incident high-energy beams 15 into light beams 25 that are passed into sensor 112.

Figure 5:
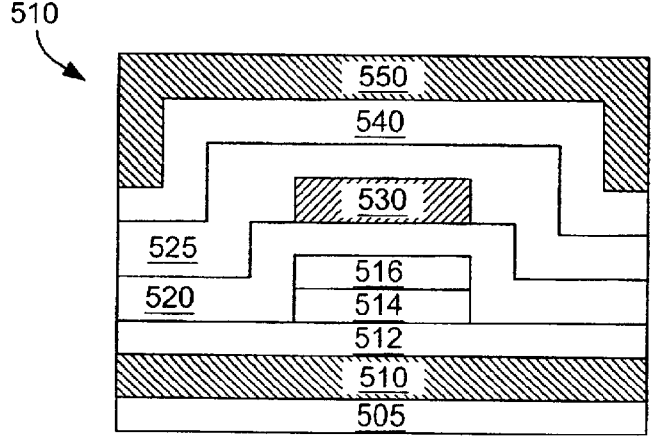
FIG. 5 is a front elevation view depicting a pixel circuit according to another embodiment of the present invention.

FIG. 5 is a cross-sectional side view showing a pixel circuit 510 of a high fill factor sensor array according to another embodiment of the present invention. Pixel circuit 510 is formed on a substrate 505 and includes a gate line 510 (shown in side view), a first passivation layer 512 (e.g., SiN) formed over gate line 512, and an a-Si:H region 514 and a second passivation region 516 (e.g., SiN) formed on first passivation layer 512. Formed over this structure is a first (bottom) buried insulator 520 upon which is formed a data line 530 (shown in end view), and a second (top) buried insulator 525. Formed over top buried insulator 525 is an a-Si:H sensor layer (charge sensing region) 540 and a top ITO contact layer 550. The fabrication of pixel circuit 510 is described in detail in "Simulated and measured data-line parasitic capacitance of amorphous silicon large-area image sensor arrays", M. Mulato, J. P. Lu and R. A. Street, Journal of Applied Physics, Vol. 89, page 638 (2000), which is incorporated herein in its entirety.

In accordance with the embodiment shown in FIG. 5, second buried insulator 525 is formed using a resin derived from B-staged bisbenzocyclobutene (BCB) monomers, such as the polymer-based CYCLOTENE® Resin produced by The Dow Chemical Company. This BCB material has a low dielectric constant and can be formed in a relatively thick (e.g., 3 to 5 microns) layer over data line 530, thereby reducing the light shield capacitance $C_{TS}$ and the sensor capacitance $C_{DS}$ capacitance components of data line capacitance (see Equation 1, above).

By combining the various design techniques described above, the present inventors were able to significantly reduce the data line capacitance of large image sensor arrays. When applied to large arrays, the combination of the BCB buried insulator structure of pixel circuit 510 (FIG. 5) combined with the air-gap crossover structure and non-overlapping TFT structure of pixel structure 110 (described with reference to FIG. 3) produced a pixel array exhibiting total data line capacitance in the range of 5–8 fF/pixel (data line capacitance without these design techniques was in the range of 44 to 79 fF/pixel). It is further noted that the BCB buried insulator of pixel circuit 510 and the non-overlapping TFT structure of pixel structure 110 accounted for only about ½ of the resulting data line capacitance reduction, and the greatest contribution was generated by introducing the air-gap crossover structure.

Although the present invention has been described with respect to certain specific embodiments, it will be clear to those skilled in the art that the inventive features of the present invention are applicable to other embodiments as well. For example, sensor arrays incorporating the present invention may be modified for indirect detection as well as direct detection methods according to known practices. Further, as mentioned above, the air-gap structure and fabrication method may be beneficially utilized in other integrated circuit types. Those familiar with integrated circuit structures will recognize such modifications can be utilized without departing from the spirit and scope of the invention described herein.

What is claimed is:

1. An integrated circuit comprising:
   a plurality of pixel circuits arranged in rows and columns;
   a plurality of first lines, each first line connected to a corresponding column of pixel circuits; and
   a plurality of second lines, each second line connected to a corresponding row of pixel circuits,
   wherein the plurality of first lines are formed such that each first line extends over the plurality of second lines at corresponding crossover locations, and
   wherein an air-gap is defined at each crossover location that separates each first line from the plurality of second lines, wherein each air-gap extends from a top surface of a corresponding second line to a bottom surface of said each first line.

2. The integrated circuit according to claim 1, wherein each pixel circuit includes an access transistor and a pixel element, wherein the access transistor includes a gate terminal connected to an associated first line, a first terminal connected to the pixel element, and a second terminal connected to an associated second line.

3. The integrated circuit according to claim 2, wherein the access transistor comprises one of amorphous silicon and polysilicon.

4. The integrated circuit according to claim 2, wherein the access transistor of each pixel circuit comprises a self-aligned thin-film transistor.

5. The integrated circuit according to claim 2, wherein each of the plurality of pixel circuits also comprises a charge sensing region that is separated from the associated second line by a buried insulator layer comprising a resin derived from B-staged bisbenzocyclobutene monomers.

6. The integrated circuit according to claim 2, wherein the integrated circuit comprises a medical image sensor array.

7. The integrated circuit according to claim 2, wherein each pixel element comprises an amorphous silicon sensor, and each pixel circuit further comprises a phosphor converter located over the amorphous silicon sensor.

8. An image sensor array comprising:
   a plurality of pixel circuits arranged in rows and columns, each pixel circuit including an access transistor;
   a plurality of gate lines, each gate line connected to the access transistors of a corresponding column of pixel circuits; and
   a plurality of data lines, each data line connected to the access transistors of a corresponding row of pixel circuits,
   wherein the plurality of data lines are formed such that each data line overlaps the plurality of gate lines at corresponding crossover locations, and
   wherein an air-gap is defined at each crossover location that separates each data line from the plurality of gate lines such that each air-gap extends from a top surface of a corresponding gate line to a bottom surface of said each data line.

9. The image sensor array according to claim 8,
   wherein the plurality of gate lines are formed from a first metal layer, the plurality of data lines are formed from a second metal layer such that the data lines are located above the first metal layer, wherein each of the plurality of pixel circuits also comprises a sensor including an amorphous silicon (a-Si:H) layer formed on a metal plate, and
   wherein the metal plate is formed from a third metal layer formed after the first and second metal layers.

10. The image sensor array according to claim 8, further comprising a strengthening insulator formed on the plurality of data lines at the crossover locations.

11. The image sensor array according to claim 8, wherein the access transistor of each pixel circuit comprises a self-aligned thin-film transistor.

12. The image sensor array according to claim 11, wherein the self-aligned thin-film transistor of each pixel circuit comprises:
   an amorphous silicon (a-Si:H) layer including a relatively undoped first region located over an associated gate line, the first region being located between a doped second region and a doped third region; and
   an optical filter island located over the first region, the optical filter island comprising at least three layers having at least two indexes of refraction and being arranged such that the optical filter island is reflective of a first radiation wavelength and transmissive of a second radiation wavelength.

13. The image sensor array according to claim 12,
   wherein each of the plurality of pixel circuits also comprises a sensor including an amorphous silicon (a-Si:H) layer formed on a metal plate,
   wherein the metal plate is connected to the doped second region of the self-aligned thin-film transistor, and
   wherein an associated data line is connected to the doped third region of the self-aligned thin-film transistor.

14. The image sensor array according to claim 8, wherein each of the plurality of pixel circuits also comprises a charge sensing region that is separated from the associated data line by a buried insulator layer comprising a resin derived from B-staged bisbenzocyclobutene monomers.

15. The image sensor array according to claim 14, wherein the buried insulator layer has a thickness of 3 to 5 microns.

16. The image sensor array according to claim 14, wherein the charge sensing region of each of the plurality of pixel circuits comprises an amorphous silicon (a-Si:H) layer.

17. The image sensor array according to claim 8,
   wherein the image sensor array further comprises spaced-apart data line support pads, and
   wherein each spaced-apart data line support pad contacts an associated data line.

18. An image sensor array comprising:
   a substrate having an upper surface defining a plane;
   a plurality of pixel circuits arranged in rows and columns over the upper surface of the substrate;
   a plurality of first lines, each first line being formed on the upper surface of the substrate and connected to a corresponding first group of said pixel circuits; and
   a plurality of second lines connected to a corresponding second group of said pixel circuits, each second line including:
      first portions supported by the upper surface of the substrate, and second portions extending over the plurality of first lines at corresponding crossover locations such that an air gap is defined at each said crossover location between a top surface of a corresponding first line and a bottom surface of the corresponding second portion of said each second line.

19. The image sensor array according to claim 18, further comprising a plurality of support pads, each support pad being formed on the upper surface of the substrate and contacting a corresponding first portion of an associated second line.

20. An image sensor array comprising:

a substrate having an upper surface defining a plane;

a plurality of pixel circuits arranged in rows and columns over the upper surface of the substrate;

a plurality of first lines, each first line being formed over the upper surface of the substrate and connected to a corresponding first group of said pixel circuits;

a plurality of support pads, each support pad being formed over the upper surface of the substrate; and a plurality of second lines connected to a corresponding second group of said pixel circuits, each second line including:

a plurality of first portions, each first portion contacting a corresponding support pad, and second portions extending between adjacent first portions such that each second portion is freely supported by an associated pair of adjacent first portions, wherein each second portion extends over a corresponding first line such that an air gap is defined between the corresponding first line and said each second portion.

* * * * *

UNITED STATES PATENT AND TRADEMARK OFFICE
CERTIFICATE OF CORRECTION

PATENT NO. : 6,940,142 B2  Page 1 of 1
DATED : September 6, 2005
INVENTOR(S) : Robert A. Street et al.

It is certified that error appears in the above-identified patent and that said Letters Patent is hereby corrected as shown below:

<u>Column 1,</u>
Line 4, insert new paragraph:
-- This invention was made with United States Government support under Agreement No. 70NANB7H3007 awarded by NIST. The United States Government has certain rights in this invention. --.

Signed and Sealed this

Sixteenth Day of May, 2006

JON W. DUDAS
*Director of the United States Patent and Trademark Office*